(12) United States Patent
Yu et al.

(10) Patent No.: US 12,719,021 B2
(45) **Date of Patent: *Aug. 25, 2026**

(54) SMART DYNAMIC LOAD SIMULATOR FOR RF POWER DELIVERY CONTROL SYSTEM

(71) Applicant: Applied Materials, Inc., Santa Clara, CA (US)

(72) Inventors: Jie Yu, Irvine, CA (US); Yue Guo, Sunnyvale, CA (US); Kartik Ramaswamy, San Jose, CA (US); Tao Zhang, San Ramon, CA (US); Shahid Rauf, Pleasanton, CA (US); John Forster, Santa Clara, CA (US); Sidharth Bhatia, Santa Cruz, CA (US); Rong Gang Zheng, Austin, TX (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 18/791,193

(22) Filed: Jul. 31, 2024

(65) Prior Publication Data

US 2024/0395505 A1 Nov. 28, 2024

Related U.S. Application Data

(63) Continuation of application No. 17/843,830, filed on Jun. 17, 2022, now Pat. No. 12,080,519.

(51) Int. Cl.
*H01J 37/32* (2006.01)

(52) U.S. Cl.
CPC .. *H01J 37/32183* (2013.01); *H01J 37/32926* (2013.01)

(58) Field of Classification Search
CPC ...................... H01J 37/32183; H01J 37/32926
See application file for complete search history.

(56) References Cited

U.S. PATENT DOCUMENTS

| | | | |
|---|---|---|---|
| 6,490,536 | B1 | 12/2002 | Ellingboe |
| 7,326,872 | B2 | 2/2008 | Shannon |
| 7,812,278 | B2 | 10/2010 | Shannon |
| 10,395,897 | B1 | 8/2019 | Wi et al. |
| 2003/0184319 | A1 | 10/2003 | Nishimori |

(Continued)

FOREIGN PATENT DOCUMENTS

| | | | |
|---|---|---|---|
| CN | 106169409 | A | 11/2016 |
| CN | 108107376 | A | 6/2018 |

(Continued)

OTHER PUBLICATIONS

Notice of Preliminary Rejection from Korean Patent Application No. 10-2025-7001293 mailed Aug. 12, 2025, 1 pg.

(Continued)

*Primary Examiner* — Henry Luong
(74) *Attorney, Agent, or Firm* — Schwabe, Williamson & Wyatt, P.C.

(57) ABSTRACT

Embodiments disclosed herein include a dynamic load simulator. In an embodiment, the dynamic load simulator comprises an impedance load, a reverse match network, and a smart RF controller. In an embodiment, the smart RF controller comprises a dynamic load generator, and a reverse match controller.

15 Claims, 6 Drawing Sheets

(56) References Cited

U.S. PATENT DOCUMENTS

| | | | | |
|---|---|---|---|---|
| 2004/0222184 | A1* | 11/2004 | Hayami ............ | H01J 37/32082 216/16 |
| 2008/0179948 | A1 | 7/2008 | Nagarkatti et al. | |
| 2013/0138402 | A1 | 5/2013 | Fang et al. | |
| 2014/0266492 | A1 | 9/2014 | Radomski et al. | |
| 2016/0240356 | A1 | 8/2016 | Howald et al. | |
| 2017/0359034 | A1 | 12/2017 | Hussein et al. | |

FOREIGN PATENT DOCUMENTS

| | | | |
|---|---|---|---|
| JP | H05-249166 | A | 9/1993 |
| JP | 2003302421 | | 10/2003 |
| JP | 2003302431 | A | 10/2003 |
| JP | 2007336148 | | 12/2007 |
| KR | 20150130336 | A | 11/2015 |
| TW | 202025863 | A | 7/2020 |
| WO | WO 2021/188857 | A1 | 9/2021 |

OTHER PUBLICATIONS

Office Action from Japanese Patent Application No. 2024-573117 mailed Sep. 16, 2025, 6 pgs.

International Preliminary Report on Patentability for International Patent Application No. PCT/US2023/023098, dated Dec. 26, 2024, 6 pgs.

Official Letter from Taiwan Patent Application No. 112120294 dated Sep. 30, 2025, 12 pgs.

International Search Report and Written Opinion from PCT/US2023/023098 dated Sep. 13, 2023, 9 pgs.

Non-Final Office Action from U.S. Appl. No. 17/843,830 dated Dec. 15, 2023, 15 pgs.

Official Letter from Taiwan Patent Application No. 112120294 dated Apr. 29, 2026, 12 pgs.

Extended European Search Report from European Patent Application No. 23824395.0-1211 dated Jul. 1, 2026, 10 pgs.

* cited by examiner

540

SMART DYNAMIC LOAD SIMULATOR

DEVELOPMENT

TESTING

OPERATION

571

572

573

SMART DYNAMIC LOAD SIMULATOR FOR RF POWER DELIVERY CONTROL SYSTEM

CROSS-REFERENCE TO RELATED APPLICATIONS

This application is a Continuation of U.S. patent application Ser. No. 17/843,830, filed on Jun. 17, 2022, the entire contents of which are hereby incorporated by reference herein.

BACKGROUND

1) Field

Embodiments relate to the field of semiconductor manufacturing and, in particular, dynamic load simulators for RF power delivery control.

2) Description of Related Art

In semiconductor processing operations, such as plasma etching or plasma deposition, an RF delivery system is used to provide RF power to the chamber. Typically, the RF delivery system includes an RF generator and an RF matching network (which is sometimes simply referred to as a match). The RF matching network allows for the input impedance to match the impedance of the plasma chamber in order to minimize or eliminate reflected power. As such, a higher level of power can be transferred to the plasma chamber. Impedance matching of the power supply and the processing chamber load is a critical requirement for the performance and safety of the RF power delivery and the wafer processing. The chamber load is a key design factor that defines the operational envelope as well as the dynamics of the power delivery system.

Currently RF system development relies on some fixed or variable dummy load. The use of such systems allow for basic verification of an RF system. However, such simplistic impedance load architectures are limited because they do not accurately match the impedance load characteristics of the plasma chamber. Accordingly, extensive and intensive process chamber testing is needed for comprehensive system validation. This leads to schedule, resource, and cost challenges. Generally, it is expensive to take a processing chamber off-line in order to implement system validation of the RF system.

SUMMARY

Embodiments disclosed herein include a dynamic load simulator. In an embodiment, the dynamic load simulator comprises an impedance load, a reverse match network, and a smart RF controller. In an embodiment, the smart RF controller comprises a dynamic load generator, and a reverse match controller.

Embodiments may also include a smart RF controller. In an embodiment, the smart RF controller may comprise a dynamic load generator configured to provide a load impedance trace on a reverse match network that is coupled to a fixed dummy load, and a reverse match controller.

Embodiments may also include a processing tool that comprises an RF delivery system with an RF generator, and an RF match network. In an embodiment, a switch is used to selectively coupled the RF delivery system to a plasma chamber or a dynamic load simulator, where the dynamic load simulator comprises, a dummy load, a reverse match network, and an RF controller. In an embodiment, the RF controller comprises a dynamic load generator, and a reverse match controller.

DETAILED DESCRIPTION

Figure 1:
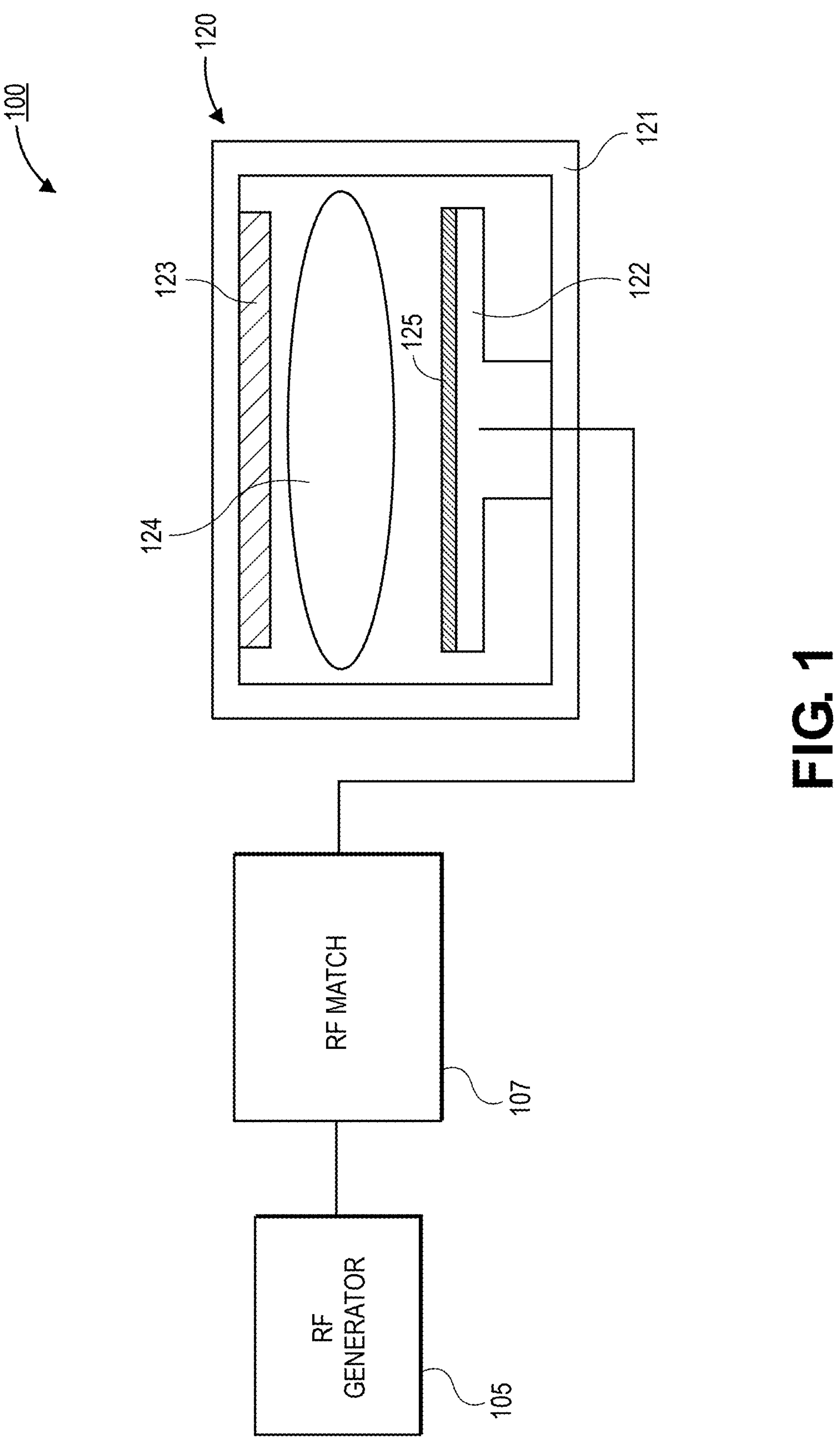
FIG. 1 is a schematic illustration of a processing tool that comprises an RF generator, an RF match, and a plasma chamber, in accordance with an embodiment.

Systems described herein include dynamic load simulators for RF power delivery control. In the following description, numerous specific details are set forth in order to provide a thorough understanding of embodiments. It will be apparent to one skilled in the art that embodiments may be practiced without these specific details. In other instances, well-known aspects are not described in detail in order to not unnecessarily obscure embodiments. Furthermore, it is to be understood that the various embodiments shown in the accompanying drawings are illustrative representations and are not necessarily drawn to scale.

As noted above, impedance matching of the power supply and the processing chamber load is a critical requirement for the performance and safety of the RF power delivery and substrate processing. However, existing architectures require extensive validation with the processing chamber electrically coupled to the power supply and the match. Since the processing chamber is being used for validation of the power supply, the cost of validating the power supply is high. That is, while being used for validation, the processing chamber needs to be taken offline, and the processing chamber cannot be used to fabricate production substrates or wafers. Generally, scheduling, resource allocation, and cost challenges must be addressed when taking a chamber offline for validation purposes.

Accordingly, embodiments disclosed herein include a smart dynamic load simulator. The smart dynamic load simulator includes a dummy load, a reverse match, and a smart RF controller. The smart RF controller controls the reverse match in order to generate a variable impedance trace from the dummy load. The variable impedance trace may be similar to the impedance trace of the processing chamber during operation. As such, the RF delivery system (i.e., the RF generator and the RF match) can be electrically coupled to the smart dynamic load simulator instead of a processing chamber. As such, the processing chamber does not need to be taken offline for validation purposes.

In an embodiment, the impedance trace may be generated using various approaches. In one approach, an impedance trace of a functioning plasma chamber is recorded. The recorded impedance trace may then be utilized by the smart RF controller. In other embodiments, the impedance trace may be generated using chamber modeling algorithms. That is, the smart RF controller may function as a digital (impedance) twin of the processing chamber in order to provide an impedance trace that matches impedance traces that would be exhibited by the chamber under certain parameters. This is particularly beneficial when corner cases are being investigated. Instead of pushing the limits on the processing chamber, the extreme conditions can be simulated in order to validate the RF delivery system.

Additionally, it is to be appreciated that the use of a smart dynamic load simulator may be used in various applications. For example, the smart dynamic load simulator may be used throughout the control system lifecycle, such as during development, testing, and operational phases. Accordingly, the cost of the smart dynamic load simulator can be spread across a plurality of different use cases.

Referring now to FIG. 1, a schematic illustration of a semiconductor processing tool 100 is shown, in accordance with an embodiment. In an embodiment, the semiconductor processing tool 100 may comprise an RF generator 105. The RF generator 105 may be any suitable RF generator architecture. For example, the RF generator 105 may operate at any desired frequency or range of frequencies. In a particular embodiment, the RF generator 105 may operate at 13.56 MHz, which is a common frequency for plasma generation. Though, it is to be appreciated that other frequencies may also be used.

In an embodiment, the RF generator 105 may be electrically coupled to an RF matching network 107. The RF matching network 107 may be referred to as an RF match or simply a match. In an embodiment, the match 107 may include circuitry (e.g., capacitors, inductors, etc.) that are configured to provide a desired input impedance to the RF generator 105. In a particular embodiment, the capacitors may include variable capacitors that are configured to have capacitance values that are changed by actuators or the like. The match 107 may be used in order to set an impedance that is equal to an impedance of the load. The load impedance may be determined by the operating conditions of the processing chamber 120.

In an embodiment, the processing chamber 120 may be any semiconductor processing tool. For example, the processing chamber 120 may be an etching tool, a deposition tool, a surface treatment tool, or the like. In a particular embodiment, the processing chamber 120 may be a plasma tool. For example, a plasma 124 may be generated within the chamber enclosure 121. The plasma 124 may be induced by one or more electrodes. For example, the support 122 may include an electrode that is electrically coupled to the RF match 107. A second electrode 123 may be provided opposite from the support 122. The second electrode 123 may also be coupled to an RF source (not shown).

In an embodiment, the support 122 may include a susceptor or other chucking architectures. For example, the support 122 may include an electrostatic chucking architecture in order to secure the substrate 125. Though, other chucking architectures (e.g., vacuum chucking) may also be used in some embodiments. In an embodiment, the support 122 may also include thermal control systems in order to control a temperature of the substrate 125. For example, cooling channels and/or resistive heaters may be included in the support 122.

In an embodiment, the substrate 125 may be any suitable substrate form factor and/or material. For example, the substrate 125 may be a wafer with a 300 mm diameter, a 450 mm diameter, or any other standard wafer form factor. In a particular embodiment, the substrate 125 may comprise silicon or any other semiconductor material. In an embodiment, a layer may be deposited onto the substrate 125, or a layer on the substrate 125 may be in the process of being etched. For example, layers typically used in semiconductor manufacturing include oxides (e.g., silicon oxide), nitrides (e.g., silicon nitride), metals (e.g., copper, tungsten, etc.), and the like.

Figure 2A:
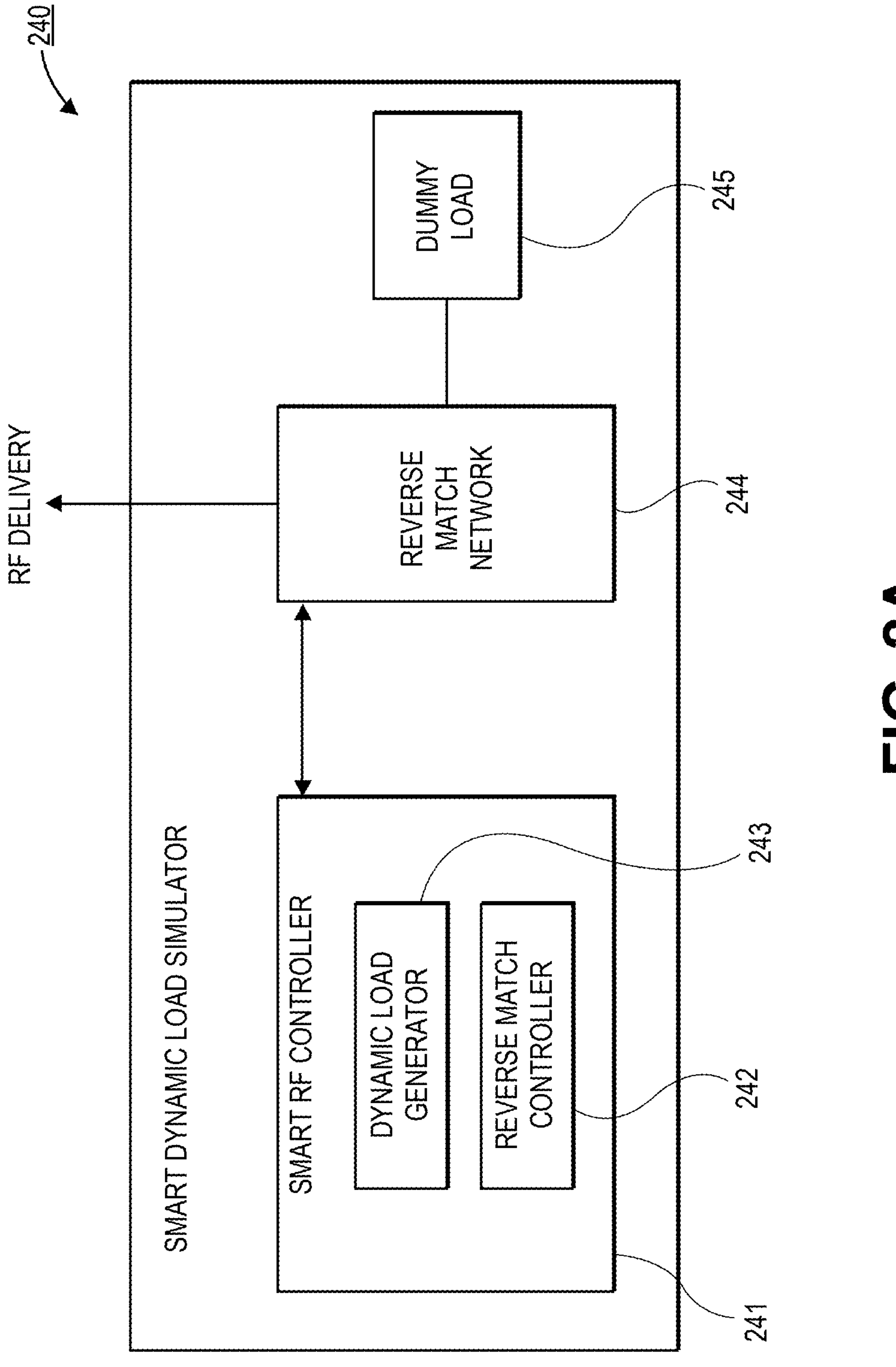
FIG. 2A is a schematic illustration of a smart dynamic load simulator with an RF controller, a reverse match network, and a dummy load, in accordance with an embodiment.

Referring now to FIG. 2A, a schematic illustration of a smart dynamic load simulator 240 is shown, in accordance with an embodiment. In an embodiment, the smart dynamic load simulator 240 may comprise an impedance load. For example, a dummy load 245 may be provided. The dummy load 245 may be a static load in some embodiments. That is, the impedance of the dummy load 245 may remain substantially constant. However, in other embodiments, the dummy load 245 may be variable. The impedance of the dummy load 245 may be a real impedance value or a complex impedance value. In an embodiment, the dummy load 245 may include a thermal regulation feature. For example, fan cooling, liquid cooling, or the like may be used in order to control the temperature of the dummy load 245. In an embodiment, the dummy load 245 may have any specific impedance value.

In an embodiment, the smart dynamic load simulator 240 may further comprise a reverse match network 244. Sometimes, the reverse match network 244 may be referred to as a reverse match 244. The reverse match network 244 may have circuitry similar to the circuitry of the match 107 described in greater detail above. For example, the reverse match 244 may include capacitors, inductors, and the like. In a particular embodiment, the capacitors may include variable capacitors that are configured to have capacitance values that are changed by actuators or the like. In yet another embodiment, the capacitors may be solid state variable capacitors. The use of solid state variable capacitors may facilitate the feedback tuning of the load generator due to the faster capacitance changes in a solid state variable capacitor compared to capacitors with physical actuators. The reverse match network 244 allows for a variable impedance to be provided, even when the dummy load 245 is constant. As such, an impedance trace may be generated in order to match the impedance of the chamber 120. As will be described in greater detail below, this allows for the RF delivery system to be developed and tested without the use of a plasma chamber 120.

In an embodiment, the reverse match network 244 may be electrically coupled to an RF delivery system (not shown). The reverse match network 244 may be coupled to the RF delivery system in order to develop and/or test the RF delivery system. In some embodiments, the reverse match network 244 may also be used during operation of the RF delivery system while processing substrates in the processing chamber. As will be descried in greater detail below, the RF delivery system may be switched between the plasma chamber and the reverse match network 244 of the smart dynamic load simulator 240.

In an embodiment, the smart dynamic load simulator 240 may further comprise a smart RF controller 241. The smart RF controller 241 may comprise a dynamic load generator 243 and a reverse match controller 242. In an embodiment, the dynamic load generator 243 may include an algorithm or model that generates the load impedance outputs based on inputs including the dummy load value, RF delivery system parameters, and/or other desired or measured process parameters. In an embodiment, the dynamic load generator 243 may operate in various modes. In a first mode, the dynamic load generator 243 may operate at a constant load. For example, the constant load may be equal to the impedance load of the dummy load 245.

In a second mode, the dynamic load generator 243 may operate at a variable static load. That is, the impedance load may be set to a static value, and the static value can be changed over time.

In a third mode, the dynamic load generator 243 may operate with a predetermined impedance load trace. For example, an impedance load of a processing chamber 120 may be recorded during a process recipe. The recorded impedance load may then be replicated by the dynamic load generator 244.

In a fourth mode, the dynamic load generator 243 may operate in a fully dynamic mode to mimic the plasma process linking the load impedance to key process variables including the RF power delivery parameters. In such an embodiment, the dynamic load generator 243 may function as an impedance twin (i.e., a digital twin) of the plasma chamber 120. Such an embodiment may be particularly beneficial in fully validating a control system since the process envelope can be pushed to extremes without risk of damaging the actual plasma chamber 120.

In an embodiment, the reverse match controller 242 may be used to ensure the fidelity of the load impedance outputs defined by the dynamic load generator 243. The reverse match controller 242 may include any suitable control algorithm. In one embodiment, the reverse match controller 242 may comprise an open loop controller. The control of an open loop reverse match controller 242 may be made through calculations based on calibration tables and/or on circuit models. In another embodiment, the reverse match controller 242 may comprise a closed loop controller. The closed loop controller may rely on real time feedback in order to provide the necessary controls. In such an embodiment, a high bandwidth loop including a fast actuator in the reverse match network 244 may be necessary in order to implement the closed loop control. In yet another embodiment, an iterative learning controller may be used for the reverse match controller 242. In an iterative controller, a first run of a process recipe may be used as feedback in order to more efficiently control a second run of the process recipe. The use of an iterative control system may mitigate the need for a high bandwidth loop.

In the illustrated embodiment, the components of the smart dynamic load simulator 240 are all shown within a single enclosure. That is, the smart dynamic load simulator 240 may be a single, fully integrated, apparatus with a single enclosure around all of the components. However, it is to be appreciated that in other embodiments, different components may be housed in different enclosures. That is, the smart dynamic simulator 240 may comprise a plurality of discrete components that are coupled together (e.g., by communication links, by electrical coupling (e.g., coaxial cables), or the like). For example, the dummy load 245 may be in a different enclosure than the reverse match network 244.

Figure 2B:
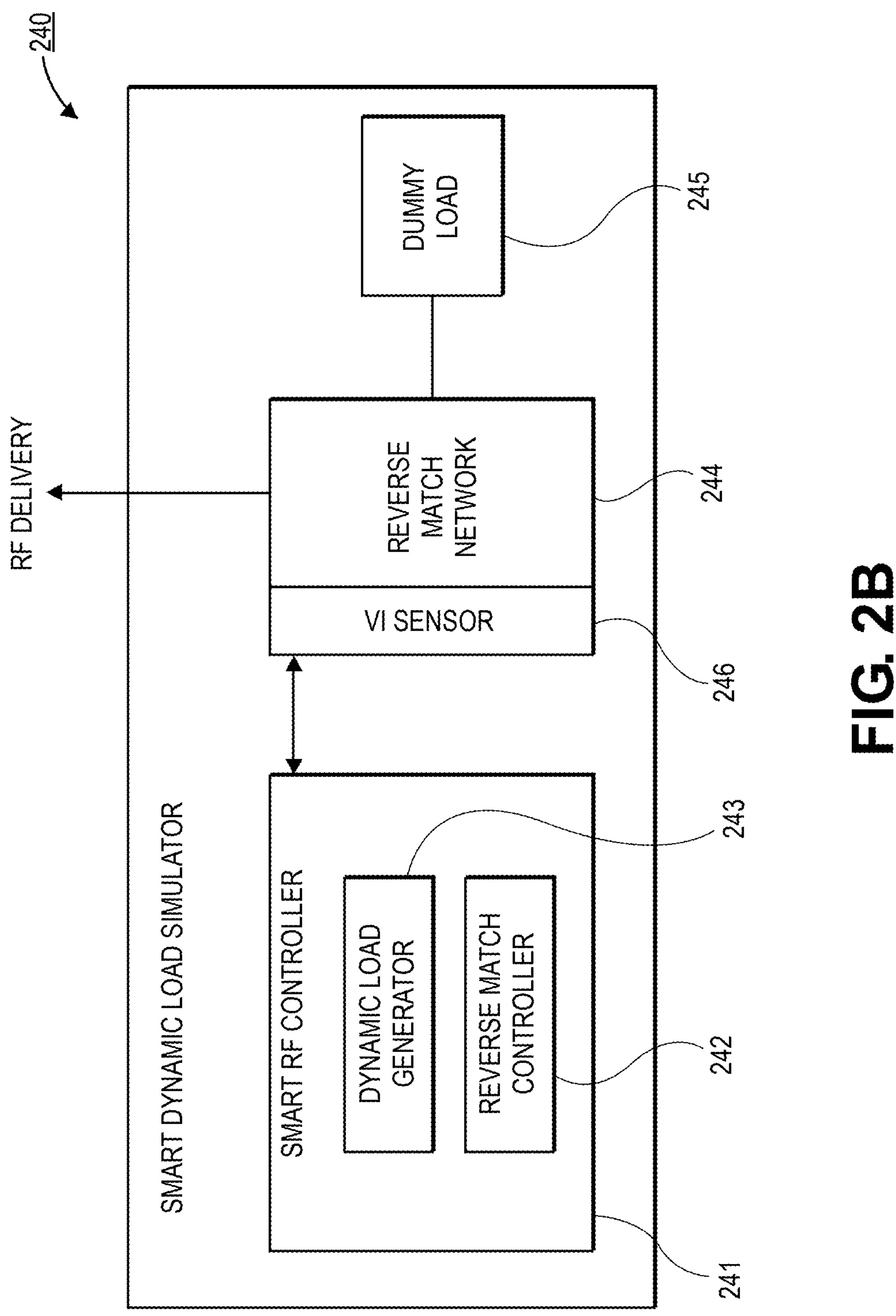
FIG. 2B is a schematic illustration of a smart dynamic load simulator with an RF controller, a reverse match network with a VI sensor, and a dummy load, in accordance with an embodiment.

Referring now to FIG. 2B, a schematic illustration of a smart dynamic load simulator 240 is shown, in accordance with an additional embodiment. As shown, the smart dynamic load simulator 240 in FIG. 2B may be substantially similar to the smart dynamic load simulator 240 in FIG. 2A, with the exception of the reverse match network 244. Particularly, the reverse match network 244 may further comprise a sensor 246. In a particular embodiment, the sensor 246 is a voltage and current (VI) sensor. The VI sensor 246 may be integrated into the reverse match network 244 for monitoring or control purposes. This ensures the accuracy of the load impedance provided to the RF delivery system. In an embodiment, the VI sensor 246 may be any sensor architecture. For example, the VI sensor 246 may comprise a conductive ring and a coaxial cable from the RF delivery system passes through the conductive ring.

Figure 3:
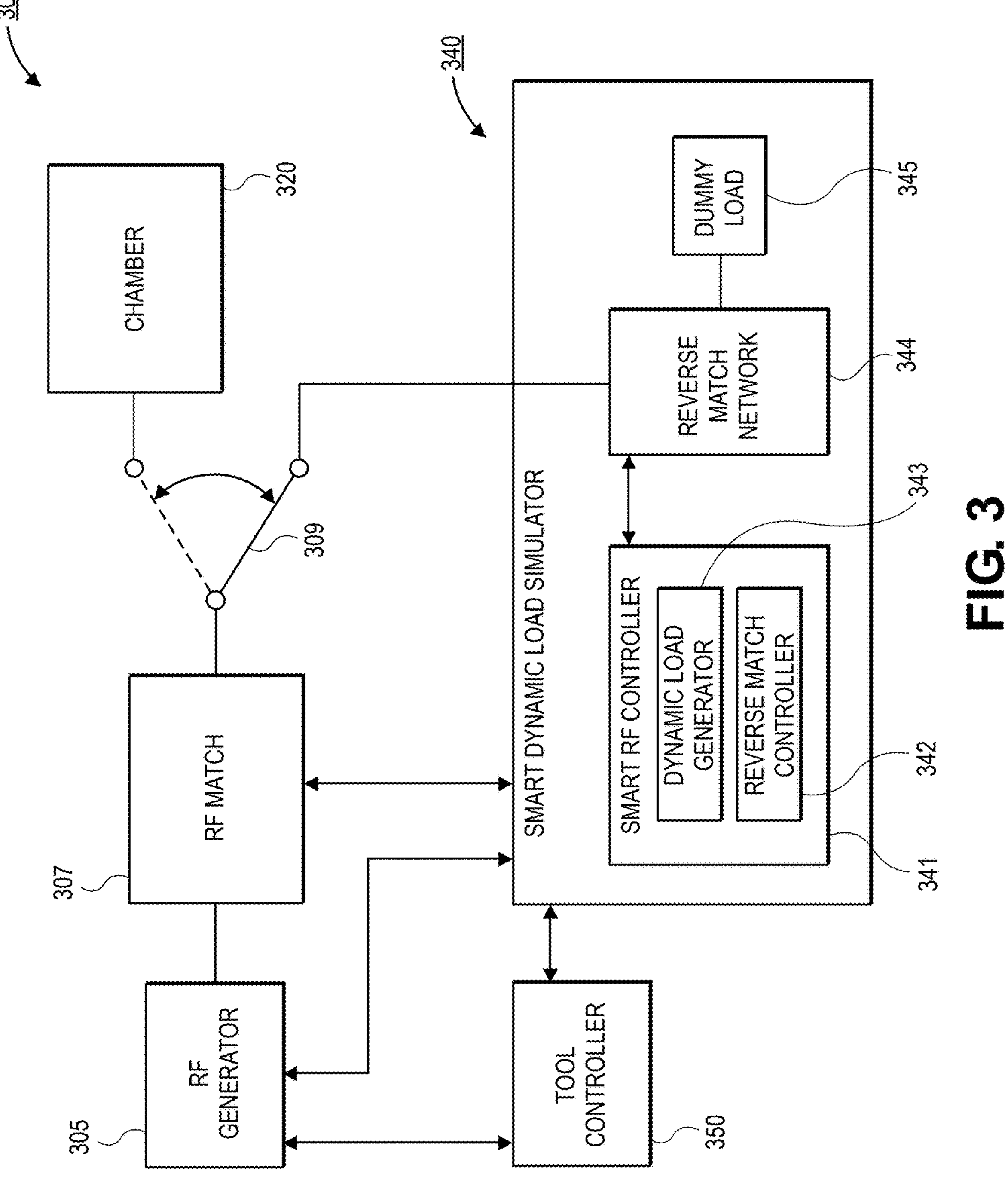
FIG. 3 is a schematic illustration of a processing tool with an RF generator, an RF match, a processing chamber, and a smart dynamic load simulator, in accordance with an embodiment.

Referring now to FIG. 3, a schematic illustration of a processing tool 300 is shown, in accordance with an embodiment. In an embodiment, the processing tool 300 may comprise an RF delivery system, a chamber 320, and a smart dynamic load simulator 340. The RF delivery system may include an RF generator 305 and an RF match 307. The RF generator 305 and the RF match 307 may be substantially similar to the similarly named features described in greater detail above. In an embodiment, the RF generator 305 and the RF match 307 may be communicatively coupled to the smart dynamic load simulator 340, as indicated by the double arrowed connection lines. The RF generator 305 may also be communicatively coupled to a tool controller 350. The tool controller 350 may be a computer system that provides control of processing parameters, executes recipes, enables device tuning, and the like.

In an embodiment, an output of the RF delivery system may be coupled to a switch 309. The switch 309 may be used to switch the output between the chamber 320 and the smart dynamic load simulator 340. In an embodiment, the chamber 320 may be substantially similar to the chamber 120 described in greater detail above. For example, the chamber 320 may be a plasma processing chamber for etching, deposition, or plasma treatment of a substrate (not shown). When the RF delivery system is electrically coupled to the chamber 320, substrates may be processed with a given recipe.

When the switch 309 is set to electrically couple the RF delivery system to the smart dynamic load simulator 340, development and/or tuning processes can be executed on the tool 300. In a particular embodiment, the RF delivery system is electrically coupled to the reverse match network 344. The reverse match network 344 provides a simulated impedance load to the RF match 307. As such, the RF match 307 can be developed or tuned without needing to execute a process recipe on the chamber 320. This reduces damage and/or ware of the chamber 320.

While an embodiment with a physical switch 309 is shown, it is to be appreciated that the switch may be a logical switch in some embodiments. For example, the smart dynamic load simulator 340 may be connector compatible with the chamber, though the smart dynamic load simulator 340 may be in a different location than the chamber 320. For example, the chamber 340 may be in a clean room, while the smart dynamic load simulator 340 may be in a regular lab. This allows for further reducing operational costs/challenges.

In an embodiment, the smart dynamic load simulator 340 may comprise a dummy load 345. The dummy load 345 may be a static load. That is, the impedance of the dummy load 345 may remain substantially constant. However, in other embodiments, the dummy load 345 may be variable. The impedance of the dummy load 345 may be a real impedance value or a complex impedance value. In an embodiment, the dummy load 345 may include a thermal regulation feature.

For example, fan cooling, liquid cooling, or the like may be used in order to control the temperature of the dummy load 345. In an embodiment, the dummy load 345 may have any specific impedance value.

In an embodiment, the smart dynamic load simulator 340 may further comprise a reverse match network 344. The reverse match network 344 may have circuitry that includes capacitors, inductors, and the like. In a particular embodiment, the capacitors may include variable capacitors that are configured to have capacitance values that are changed by actuators or the like. The reverse match network 344 allows for a variable impedance to be provided, even when the dummy load 345 is constant. As such, an impedance trace may be generated in order to match the impedance of the chamber 320.

In an embodiment, the smart dynamic load simulator 340 may further comprise a smart RF controller 341. The smart RF controller 341 may comprise a dynamic load generator 343 and a reverse match controller 342. In an embodiment, the dynamic load generator 343 may include an algorithm or model that generates the load impedance outputs based on inputs including the dummy load value, RF delivery system parameters, and/or other desired or measured process parameters. In an embodiment, the dynamic load generator 343 may operate in various modes (e.g., a constant load, a variable static load, a predetermined impedance load trace, or a fully dynamic mode). An explanation of the different modes are described in greater detail above.

In an embodiment, the reverse match controller 342 may be used to ensure the fidelity of the load impedance outputs defined by the dynamic load generator 343. The reverse match controller 342 may include any suitable control algorithm (e.g., an open loop controller, a closed loop controller, or an iterative learning controller). An explanation of the different control algorithms are provided in greater detail above.

Figures 4, 5:
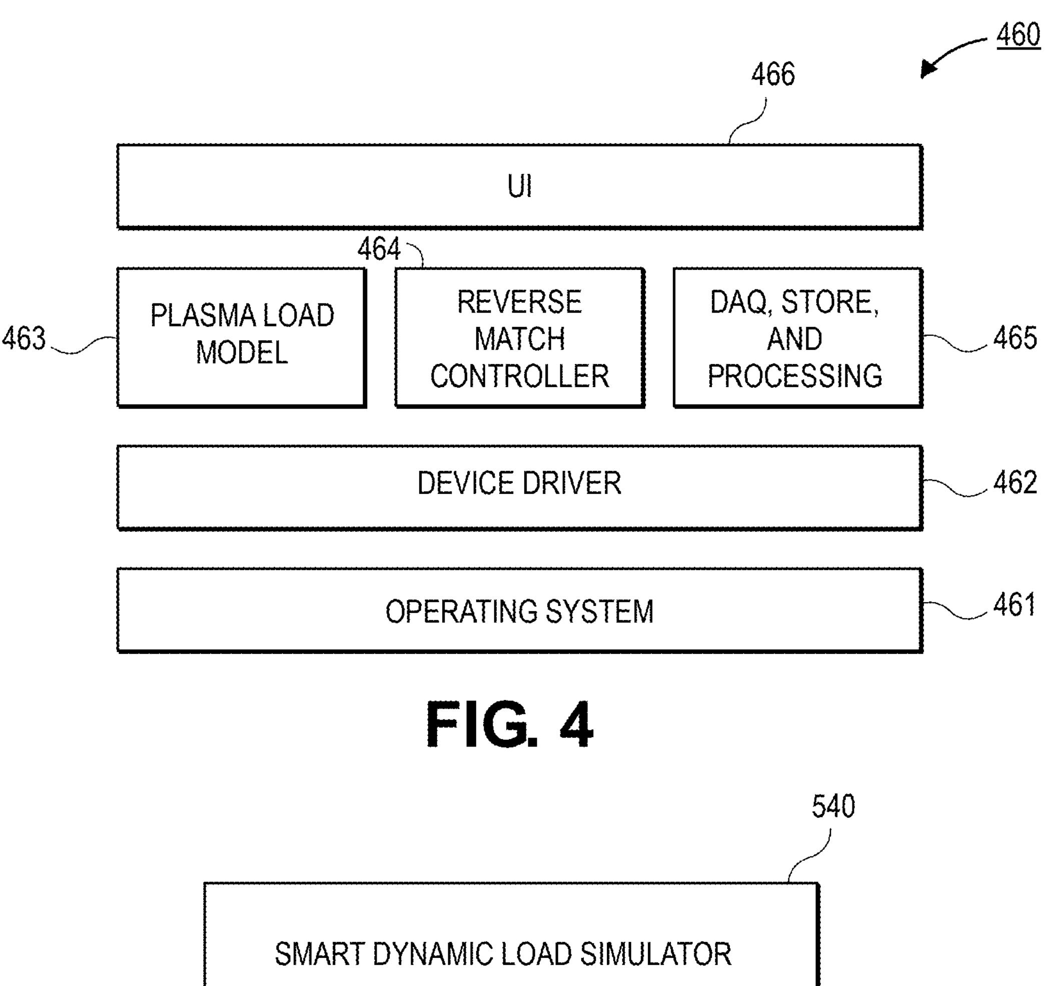
FIG. 4 is an illustration of the software stack used for a smart dynamic load simulator, in accordance with an embodiment.
FIG. 5 is an illustration depicting the use cases of a smart dynamic load simulator, in accordance with an embodiment.

Referring now to FIG. 4, a schematic illustration of a software stack 460 for a smart dynamic load simulator is shown, in accordance with an embodiment. In an embodiment, the software stack 460 may comprise an operating system 461. The operating system 461 may be any suitable operating system. For example, Windows, Raspberry Pi, Linux, macOS, and the like may be used for the operating system 461. In an embodiment, device drivers 462 may also be included in the software stack 460. Different drivers 462 may be used for the different components of the smart dynamic load simulator. For example, a driver for the dummy load, a driver for the reverse RF match, and a driver for the smart RF controller may be provided.

In an embodiment, the software stack 460 may further comprise a plasma load model 463. The plasma load model 463 my operate with the dynamic load generator. In an embodiment, the plasma load model 463 may be a model used to replicate a previously recorded impedance trace. For example, a process recipe may be executed in a processing chamber. The impedance of the processing chamber throughout the recipe may be recorded. The plasma load model 463 is then able to replicate the impedance trace using the reverse RF match. In another embodiment, the plasma load model 463 may be an impedance twin of the processing chamber. For example, the plasma load model 463 may be a physics based model that is used mimic the plasma process linking the load impedance to key process variables including the RF power delivery parameters.

When used as an impedance twin, the plasma load model 463 enables improved tuning and development processes. This is because the plasma load model 463 can safely execute corner conditions that may otherwise damage or cause excessive wear in the processing chamber if executed for real.

In an embodiment, the software stack 460 may further comprise a reverse match controller 464 algorithm. In an embodiment, the reverse match controller 464 may include one or more different control algorithms. In one embodiment, the reverse match controller 464 comprises an open loop controller. The open loop controller may utilize calculations based on calibration tables and/or circuit models. In an additional embodiment, the reverse match controller 464 may comprise a closed loop control algorithm. In a closed loop control algorithm real time feedback can be provided in order to improve the control. In yet another embodiment, an iterative leaning control algorithm may be included in the reverse match controller 464. An iterative learning control algorithm may use a first process run as an input in order to improve the control of successive processes runs.

In an embodiment, the software stack 460 may also comprise a data acquisition (DAQ), store, and processing module 465. The module 465 may use any suitable circuitry, memory, processors, or the like. The module 465 may work in conjunction with the plasma load model 463 and the reverse match controller 464 in order to execute various processes with the smart dynamic load simulator.

In an embodiment, the software stack 460 may further comprise a user interface (UI) 466. The user interface 466 may be provided on a screen or the like in order for a user to interact with the smart dynamic load simulator. The UI 466 may be designed to have any desired layout or other UI functionality.

Referring now to FIG. 5, an illustration depicting the flexibility of the smart dynamic load simulator 540 is shown, in accordance with an embodiment. Particularly, FIG. 5 illustrates the various operating modes that may be used in conjunction with the smart dynamic load simulator 540. Namely, the smart dynamic load simulator 540 may be used for development applications 571, testing applications 572, and operation applications 573.

In an embodiment, the system development application 571 can be used in order to develop a control system for the RF delivery system. The interchangeable simulator and plasma chamber connection to the RF control system under development can significantly reduce the development and/or deployment lead time. This improvement in development duration is provided because there is a reduced need for chamber access. That is, the development process can be implemented with a much more flexible schedule since no chamber is needed. Additionally, embodiments allow for the overlapping of chamber process design and RF control system design/verification. Essentially, the RF control system can be designed at the same time the chamber process is being designed since the RF control system does not require a dedicated processing chamber in order to be developed.

In an embodiment, the testing applications 572 also provide enhancements over existing solutions. For example, ease and safety of corner condition testing and stress testing are improved. Typically corner condition testing and stress testing, by design, push the processing chamber to its limits. Such testing can, therefore, cause excessive wear and/or damage to the processing chamber. Instead of using a physical test of the chamber, the smart dynamic load simulator can replicate the impedances of such tests in order to test the RF control system. Accordingly, testing costs and durations can be reduced when embodiments disclosed herein are used.

Furthermore, embodiments disclosed herein allow for use of the smart dynamic load simulator during operation applications 573. For example, the dynamic load model can be used to replace the need for output sensors (e.g., VI sensors) on the matching network. As such, the cost of the RF control system can be reduced.

Accordingly, embodiments disclosed herein include a smart dynamic load simulator that can be used to model an impedance of a processing chamber for development, testing, or application purposes. Generally, the smart dynamic load simulator includes a dummy load, a reverse match, and a smart RF controller. The smart RF controller controls the reverse match in order to generate a variable impedance trace from the dummy load. The variable impedance trace may be similar to the impedance trace of the processing chamber during operation. For example, a recorded impedance of the chamber during operation may be mimicked or an impedance twin functionality may be used to generate an impedance trace. As such, the RF delivery system (i.e., the RF generator and the RF match) can be electrically coupled to the smart dynamic load simulator instead of a processing chamber. As such, the processing chamber does not need to be taken offline for validation purposes, nor does the processing chamber even need to be fully developed before RF delivery system development.

Figure 6:
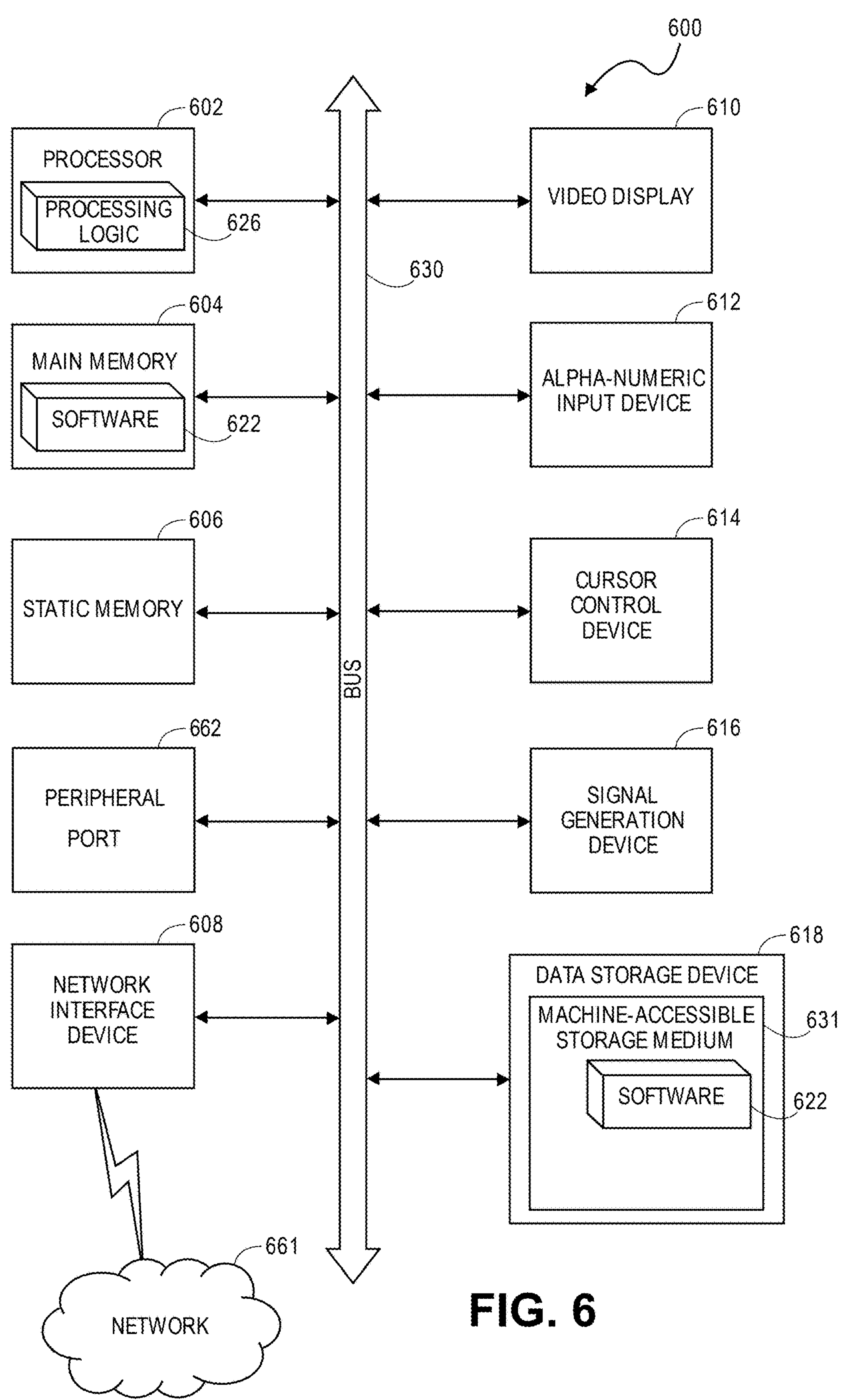
FIG. 6 illustrates a block diagram of an exemplary computer system that may be used in conjunction with a processing tool, in accordance with an embodiment.

Referring now to FIG. 6, a block diagram of an exemplary computer system 600 of a processing tool is illustrated in accordance with an embodiment. The exemplary computer system 600 may be used for one or more systems described in greater detail above. For example, the exemplary computer system may be used for the tool controller and/or the smart RF controller. In an embodiment, computer system 600 is coupled to and controls processing in the processing tool. Computer system 600 may be connected (e.g., networked) to other machines in a Local Area Network (LAN), an intranet, an extranet, or the Internet. Computer system 600 may operate in the capacity of a server or a client machine in a client-server network environment, or as a peer machine in a peer-to-peer (or distributed) network environment. Computer system 600 may be a personal computer (PC), a tablet PC, a set-top box (STB), a Personal Digital Assistant (PDA), a cellular telephone, a web appliance, a server, a network router, switch or bridge, or any machine capable of executing a set of instructions (sequential or otherwise) that specify actions to be taken by that machine. Further, while only a single machine is illustrated for computer system 600, the term "machine" shall also be taken to include any collection of machines (e.g., computers) that individually or jointly execute a set (or multiple sets) of instructions to perform any one or more of the methodologies described herein.

Computer system 600 may include a computer program product, or software 622, having a non-transitory machine-readable medium having stored thereon instructions, which may be used to program computer system 600 (or other electronic devices) to perform a process according to embodiments. A machine-readable medium includes any mechanism for storing or transmitting information in a form readable by a machine (e.g., a computer). For example, a machine-readable (e.g., computer-readable) medium includes a machine (e.g., a computer) readable storage medium (e.g., read only memory ("ROM"), random access memory ("RAM"), magnetic disk storage media, optical storage media, flash memory devices, etc.), a machine (e.g., computer) readable transmission medium (electrical, optical, acoustical or other form of propagated signals (e.g., infrared signals, digital signals, etc.)), etc.

In an embodiment, computer system 600 includes a system processor 602, a main memory 604 (e.g., read-only memory (ROM), flash memory, dynamic random access memory (DRAM) such as synchronous DRAM (SDRAM) or Rambus DRAM (RDRAM), etc.), a static memory 606 (e.g., flash memory, static random access memory (SRAM), etc.), and a secondary memory 618 (e.g., a data storage device), which communicate with each other via a bus 630.

System processor 602 represents one or more general-purpose processing devices such as a microsystem processor, central processing unit, or the like. More particularly, the system processor may be a complex instruction set computing (CISC) microsystem processor, reduced instruction set computing (RISC) microsystem processor, very long instruction word (VLIW) microsystem processor, a system processor implementing other instruction sets, or system processors implementing a combination of instruction sets. System processor 602 may also be one or more special-purpose processing devices such as an application specific integrated circuit (ASIC), a field programmable gate array (FPGA), a digital signal system processor (DSP), network system processor, or the like. System processor 602 is configured to execute the processing logic 626 for performing the operations described herein.

The computer system 600 may further include a system network interface device 608 for communicating with other devices or machines over a network 661. Additionally, the computer system 600 may include a peripheral port (e.g., a serial port, a USB port, or the like) in order to communicate with other components external to the computer system 600. The computer system 600 may also include a video display unit 610 (e.g., a liquid crystal display (LCD), a light emitting diode display (LED), or a cathode ray tube (CRT)), an alphanumeric input device 612 (e.g., a keyboard), a cursor control device 614 (e.g., a mouse), and a signal generation device 616 (e.g., a speaker).

The secondary memory 618 may include a machine-accessible storage medium 632 (or more specifically a computer-readable storage medium) on which is stored one or more sets of instructions (e.g., software 622) embodying any one or more of the methodologies or functions described herein. The software 622 may also reside, completely or at least partially, within the main memory 604 and/or within the system processor 602 during execution thereof by the computer system 600, the main memory 604 and the system processor 602 also constituting machine-readable storage media. The software 622 may further be transmitted or received over a network 620 via the system network interface device 608. In an embodiment, the network interface device 608 may operate using RF coupling, optical coupling, acoustic coupling, or inductive coupling.

While the machine-accessible storage medium 632 is shown in an exemplary embodiment to be a single medium, the term "machine-readable storage medium" should be taken to include a single medium or multiple media (e.g., a centralized or distributed database, and/or associated caches and servers) that store the one or more sets of instructions. The term "machine-readable storage medium" shall also be taken to include any medium that is capable of storing or encoding a set of instructions for execution by the machine and that cause the machine to perform any one or more of the methodologies. The term "machine-readable storage medium" shall accordingly be taken to include, but not be limited to, solid-state memories, and optical and magnetic media.

In the foregoing specification, specific exemplary embodiments have been described. It will be evident that various modifications may be made thereto without departing from the scope of the following claims. The specification and drawings are, accordingly, to be regarded in an illustrative sense rather than a restrictive sense.

What is claimed is:

1. A dynamic load simulator, comprising:
an impedance load;
a reverse match network; and
a smart RF controller, wherein the smart RF controller comprises:
a dynamic load generator; and
a reverse match controller, wherein the dynamic load generator is configured to generate a load impedance output based on an input comprising the impedance load, and wherein the reverse match controller is configured to ensure a fidelity of the load impedance output generated by the dynamic load generator.

2. The dynamic load simulator of claim 1, wherein the reverse match network further comprises a sensor.

3. The dynamic load simulator of claim 2, wherein the sensor is a voltage sensor and a current sensor.

4. The dynamic load simulator of claim 1, wherein the impedance load is a dummy load.

5. The dynamic load simulator of claim 4, wherein the reverse match network is configured to tune the dummy load to a desired impedance load different from the dummy load.

6. The dynamic load simulator of claim 1, wherein the impedance load is thermally controlled with a cooling system.

7. The dynamic load simulator of claim 1, wherein the impedance load, the reverse match network, and the RF controller are components within a single housing.

8. The dynamic load simulator of claim 1, wherein the impedance load, the reverse match network, and the smart RF controller are discrete components in different housings.

9. The dynamic load simulator of claim 1, wherein the dynamic load simulator is selectively coupled to an RF delivery system.

10. The dynamic load simulator of claim 9, wherein the RF delivery system is configured to be switched between a processing chamber and the dynamic load simulator.

11. A smart RF controller, comprising:
a dynamic load generator configured to provide a load impedance trace on a reverse match network that is coupled to a dummy load; and
a reverse match controller, wherein the dynamic load generator is configured to generate a load impedance output based on an input comprising the impedance load, and wherein the reverse match controller is configured to ensure a fidelity of the load impedance output generated by the dynamic load generator.

12. The smart RF controller of claim 11, wherein its hardware is implemented as a computer system.

13. The smart RF controller of claim 11, wherein the impedance trace is a pre-recorded trace of an impedance of a plasma chamber.

14. The smart RF controller of claim 11, wherein load impedance trace is generated by a dynamic model of a plasma chamber.

15. The smart RF controller of claim 11, wherein the reverse match controller is an open loop controller, a closed loop controller, or is configured to use iterative learning.

* * * * *